United States Patent
Rahman et al.

(10) Patent No.: US 7,417,454 B1
(45) Date of Patent: Aug. 26, 2008

(54) LOW-SWING INTERCONNECTIONS FOR FIELD PROGRAMMABLE GATE ARRAYS

(75) Inventors: Arifur Rahman, San Jose, CA (US); Tim Tuan, San Jose, CA (US); Sean W. Kao, Campbell, CA (US)

(73) Assignee: XILINX, Inc., San Jose, CA (US)

( * ) Notice: Subject to any disclaimer, the term of this patent is extended or adjusted under 35 U.S.C. 154(b) by 122 days.

(21) Appl. No.: 11/210,498

(22) Filed: Aug. 24, 2005

(51) Int. Cl.
*H03K 19/173* (2006.01)
(52) U.S. Cl. .............................. 326/38; 326/41; 326/47; 326/113
(58) Field of Classification Search .............. 326/37–41, 326/80–83, 86, 47, 113, 63, 68
See application file for complete search history.

(56) References Cited

U.S. PATENT DOCUMENTS

| | | | | |
|---|---|---|---|---|
| 4,918,336 | A * | 4/1990 | Graham et al. | 326/117 |
| 5,426,383 | A * | 6/1995 | Kumar | 326/119 |
| 5,543,734 | A * | 8/1996 | Volk et al. | 326/83 |
| 6,768,338 | B1 * | 7/2004 | Young et al. | 326/44 |
| 6,806,732 | B1 * | 10/2004 | Kaviani | 326/39 |
| 6,914,449 | B2 * | 7/2005 | Kaviani | 326/41 |
| 7,215,141 | B2 * | 5/2007 | Lewis | 326/41 |

OTHER PUBLICATIONS

Rabaey, Jan M. et al.; "Digital Integrated Circuits", A Design Perspective, 2003, Ch. 5, pp. 214-219, 2nd Ed., available from Prentice Hall Electronics and VLSI Series, 800 East 96th Street Indianapolis, Indiana, month N/A.

* cited by examiner

*Primary Examiner*—Rexford Barnie
*Assistant Examiner*—Jason M Crawford
(74) *Attorney, Agent, or Firm*—William L. Paradice, III; John J. King

(57) ABSTRACT

An apparatus is disclosed that may reduce the dynamic power dissipation of a configurable IC device such as an FPGA by reducing the peak-to-peak voltage swing of signals transmitted over the device's interconnect signal lines without including additional level shifter circuits. For some embodiments, existing multiplexing circuit architectures provided within logic resources of various logic blocks of the configurable IC device may be used as level shifter circuits to increase the voltage swing of signals received into the blocks from the interconnect signal lines, and modified multiplexing circuit architectures provided within the logic resources may be used to reduce the voltage swing of signals output from the logic blocks onto the interconnect signal lines.

16 Claims, 10 Drawing Sheets

US 7,417,454 B1

LOW-SWING INTERCONNECTIONS FOR FIELD PROGRAMMABLE GATE ARRAYS

FIELD OF INVENTION

The present invention relates generally to integrated circuits, and more specifically to shifting the voltage swing of signals transmitted between various resources of a configurable integrated circuit device.

DESCRIPTION OF RELATED ART

A configurable integrated circuit (IC) is an integrated circuit including various configurable resources. A programmable logic device (PLD) is a well-known type of configurable IC that can be programmed by a user to implement a variety of selected functions. PLDs are becoming increasingly popular with circuit designers because they require less time to design than custom-designed integrated circuits such as Application Specific Integrated Circuits (ASICs).

There are many types of PLDs such as Field Programmable Gate Arrays (FPGAs) and complex PLDs (CPLDs). For example, an FPGA typically includes a plurality of configurable logic blocks (CLBs), a plurality of input/output blocks (IOBs), and a number of block RAM elements selectively connected to each other to implement complex user designs by a programmable interconnect structure. The CLBs are individually programmable and can be configured to perform a variety of logic functions. The IOBs are selectively connected to various I/O pins of the FPGA, and can be configured as either input buffers or output buffers. The block RAM elements can store data during operation of the FPGA and/or can be configured to implement various functions such as FIFO memories and state machines. The various functions and signal interconnections implemented by the CLBs, IOBs, and the programmable interconnect structure are controlled by a number of corresponding configuration memory cells that store configuration data that embodies a desired user design. An FPGA may include other types of configurable resources, such as multipliers, processors, transceivers, DSP blocks, clock managers, etc.

An FPGA's programmable interconnect structure typically includes a plurality of programmable switch blocks (PSBs) that selectively interconnect any number of interconnect signal lines of varying lengths in response to configuration bits stored in corresponding configuration memory cells to programmably route signals between the various configurable resources provided within the FPGA. For example, many FPGA devices available from Xilinx, Inc., the assignee of the present invention, may include single-length signal lines that extend between adjacent CLB tiles, intermediate-length signal lines (e.g., double-length and hex signal lines) that extend across several CLB tiles, and/or global signal lines that extend across the entire FPGA device. Each signal line in the FPGA's programmable interconnect structure has an associated wire capacitance that undesirably results in dynamic power dissipation when signals are routed over the interconnect signal lines.

For example, FIG. 1 shows a simplified portion 100 of a conventional FPGA architecture that includes a first CLB 110A, a second CLB 110B, a programmable switch block (PSB) 120, a first plurality of interconnect signal lines 121A coupled between CLB 110A and PSB 120, and a second plurality of interconnect signal lines 121B coupled between PSB 120 and CLB 110B. For simplicity, the interconnect signal lines 121A-121B are represented collectively in FIG. 1. Further, other well-known components of the FPGA (e.g., other CLBs, other PSBs, other interconnect signal lines, and other various configurable resources) are not shown in FIG. 1 for simplicity. For example, although not shown in FIG. 1 for simplicity, CLB 110A may have I/O connections to other resources via other interconnect signal lines, CLB 110B may have I/O connections to other resources via other interconnect signal lines, and PSB 120 may have I/O connections to other resources via other interconnect signal lines.

Each CLB 110A-110B has a power terminal coupled to a core voltage supply VDD, and includes a number of configurable logic elements such as slices 112A and 112B, respectively. For simplicity, only one slice 112 is shown in each CLB 110 of FIG. 1. Each slice 112 includes a plurality of well-known input multiplexing (IMUX) circuits 113, a plurality of well-known function generators (FG) 114, a plurality of well-known output multiplexing (OMUX) circuits 115, and various other well-known logic-elements (not shown for simplicity) that together may be programmed to implement a variety of logic functions in response to configuration data provided thereto. For example, IMUX circuits 113 selectively route input signals from the interconnect signal lines to FG 114, which in turn may be configured (e.g., using configuration data) to implement various logic functions in a well-known manner. OMUX circuits 115 selectively route signals output from FG 114 to other FPGA resources via designated interconnect signal lines.

PSB 120 has a power terminal coupled to VDD, and includes well-known routing logic 122 that may be configured (e.g., using configuration data) to selectively route signals between interconnect signal lines 121A and 121B. As mentioned above, PSB 120 typically includes I/O connections to other various FPGA resources via other interconnect signal lines. Thus, although not shown for simplicity, routing logic 122 may be configured to selectively route signals between other interconnect signal lines. Accordingly, routing logic 122 of PSB 120 may receive signals from any number of CLBs such as CLB 110A and/or from other PSBs via the interconnect signal lines, and may output signals to any number of CLBs such as CLB 110B and/or to other PSBs via the interconnect signal lines.

As known in the art, logic signals processed within CLBs 110A-110B and PSB 120 of FPGA portion 100 typically have a peak-to-peak voltage swing (that is, the maximum voltage swing between a logic 0 and a logic 1) between approximately 0 volts and VDD to maximize performance of various logic circuitry provided in the CLBs and PSB. Accordingly, logic signals output from CLBs 110A-110B and PSB 120 onto interconnect signal lines 121 typically have a peak-to-peak voltage swing between approximately 0 volts and VDD. As a result, signals transmitted over the interconnect signal lines of FPGA portion 100 typically have a peak-to-peak voltage swing between approximately 0 volts and VDD.

FIG. 2 shows a well-known multiplexing circuit 200 that is typically used to implement IMUX circuits 113A-113B and/or OMUX circuits 115A-115B of CLBs 110A-110B, respectively, and/or routing logic 122 of PSB 120. Circuit 200 includes a multiplexer circuit (MUX) 210, a level-restoring circuit 220, and an output buffer 230. MUX 210 includes a plurality of NMOS pass transistors MN0-MNn for selectively passing respective input signals IN(0)-IN(n) to an input node N1 of level-restoring circuit 220 in response to respective control signals M(0)-M(n). The input signals IN(0)-IN(n) provided to circuit 200 have a peak-to-peak voltage swing between approximately 0 volts and VDD. Control signals M(0)-M(n), which may be configuration bits stored in corresponding configuration memory cells (not shown for simplicity), typically have a voltage swing between 0 and a reference voltage Vref, where Vref is typically greater than or equal to VDD. Thus, when the gate of a selected NMOS pass transistor MNx is asserted to Vref, the voltage level of a logic "1" input signal IN(x) is reduced by the threshold voltage (VT) of the selected pass transistor, e.g., from approximately VDD to approximately VDD-VT.

Level-restoring circuit 220, which includes a well-known CMOS inverter 222 coupled between input node N1 and output node N2 and includes a weak PMOS pull-up transistor MP1 coupled between VDD and node N1 and having a gate coupled to node N2, ensures that logic signals output from circuit 200 have a peak-to-peak voltage swing between approximately 0 volts and VDD. For example, if a logic "1" input signal IN(0) is provided to input node N1 via pass transistor MN0, node N1 is at approximately VDD-VT. CMOS inverter 222 inverts the logic high signal at node N1 to create a logic low signal at output node N2 that turns on weak PMOS pull-up transistor MP1, which in turn pulls the voltage level of input signal IN(0) at node N1 from VDD-VT to approximately VDD. Although not shown for simplicity, CMOS inverter 222 has power terminals coupled to VDD and to ground potential.

Output buffer 230, which is a well-known CMOS inverter having powers terminals coupled to VDD and to ground potential, logically complements the logic signal at node N2 to generate an output signal OUT having a voltage swing between 0 and VDD, which as mentioned above is suitable for maximizing performance of various logic circuitry within CLBs 110A-110B and PSB 120. Capacitor C1 models the capacitance of interconnect signal lines 121. Although output buffer 230 is shown in the exemplary diagram of FIG. 2 as being separate from level-restoring circuit 220, level-restoring circuit 220 may include output buffer 230, or may be included as part of other circuits.

As mentioned above, signals transmitted over interconnect signal lines 121 of FPGA portion 100 typically have a peak-to-peak voltage swing between approximately 0 volts and VDD. The power dissipation associated with transmitting signals over interconnect signal lines such as signal lines 121 typically accounts for a significant portion of the total dynamic power dissipation of configurable IC devices such as FPGA 100. As semiconductor process geometries continue to decrease, which allows for increasing numbers of circuit elements to be formed in a given area, dynamic power dissipation becomes increasingly important. Thus, it would be desirable to reduce the dynamic power dissipation of configurable IC devices such as FPGA devices.

SUMMARY

An apparatus is disclosed that may reduce the dynamic power dissipation of a configurable IC device such as an FPGA by reducing the peak-to-peak voltage swing of signals transmitted over the device's interconnect signal lines without including additional level shifter circuits. In accordance with some embodiments of the present invention, existing multiplexing circuit architectures provided within logic resources of various logic blocks of the configurable IC device may be used as level shifter circuits to increase the voltage swing of signals received into the blocks from the interconnect signal lines, and modified multiplexing circuit architectures provided within the logic resources may be used to reduce the voltage swing of signals output from the logic blocks onto the interconnect signal lines.

For some embodiments, a configurable IC device may include any number of logic blocks such as configurable logic blocks and/or programmable switch blocks interconnected by any number of sets of signal lines, where each logic block may include logic resources, and one or more of either an input multiplexing circuit, an output multiplexing circuit, or both. The input multiplexing circuit may be coupled between a first corresponding set of interconnect signal lines and the logic resources, and the output multiplexing circuit may be coupled between the logic resources and a second corresponding set of interconnect signal lines. Signals processed within the logic resources have a relatively high voltage swing, and signals transmitted over the interconnect signal lines have a relatively low voltage swing. For one embodiment, the relatively high voltage swing is between approximately ground potential and a supply voltage VDD, and the relatively low voltage swing is between approximately ground potential and VDD-VT, where VT is the threshold voltage of a CMOS transistor implemented within the output multiplexing circuit.

In operation, the input multiplexing circuit translates the voltage swing of logic signals received from the interconnect signal lines from a relatively low peak level to a relatively high peak level suitable for processing within the logic block's resources, and the output multiplexing circuit translates the voltage swing of logic signals received from the logic block's resources from a relatively high peak level to a relatively low peak level suitable for transmitting the signals over the interconnect signal lines. In this manner, embodiments of the present invention may reduce dynamic power consumption by reducing the voltage swing of signals transmitted over the interconnect signal lines while maximizing performance by increasing the voltage swing of signals to be processed within the logic blocks' resources.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Although described below in the context of an exemplary FPGA device, embodiments of the present invention are equally applicable to other configurable devices (e.g., various FPGA architectures and other programmable logic devices (PLDs) such as complex PLDs), including devices that may be partially configurable, and to other non-configurable devices (e.g., application-specific integrated circuits). In the following description, for purposes of explanation, specific nomenclature is set forth to provide a thorough understanding of the present invention. In other instances, well-known circuits and devices are shown in block diagram form to avoid obscuring the present invention. Further, the logic levels assigned to various signals in the description below are arbitrary and, thus can be modified (e.g., reversed polarity) as desired. Accordingly, the present invention is not to be construed as limited to specific examples described herein but rather includes within its scope all embodiments defined by the appended claims.

Figure 3A:
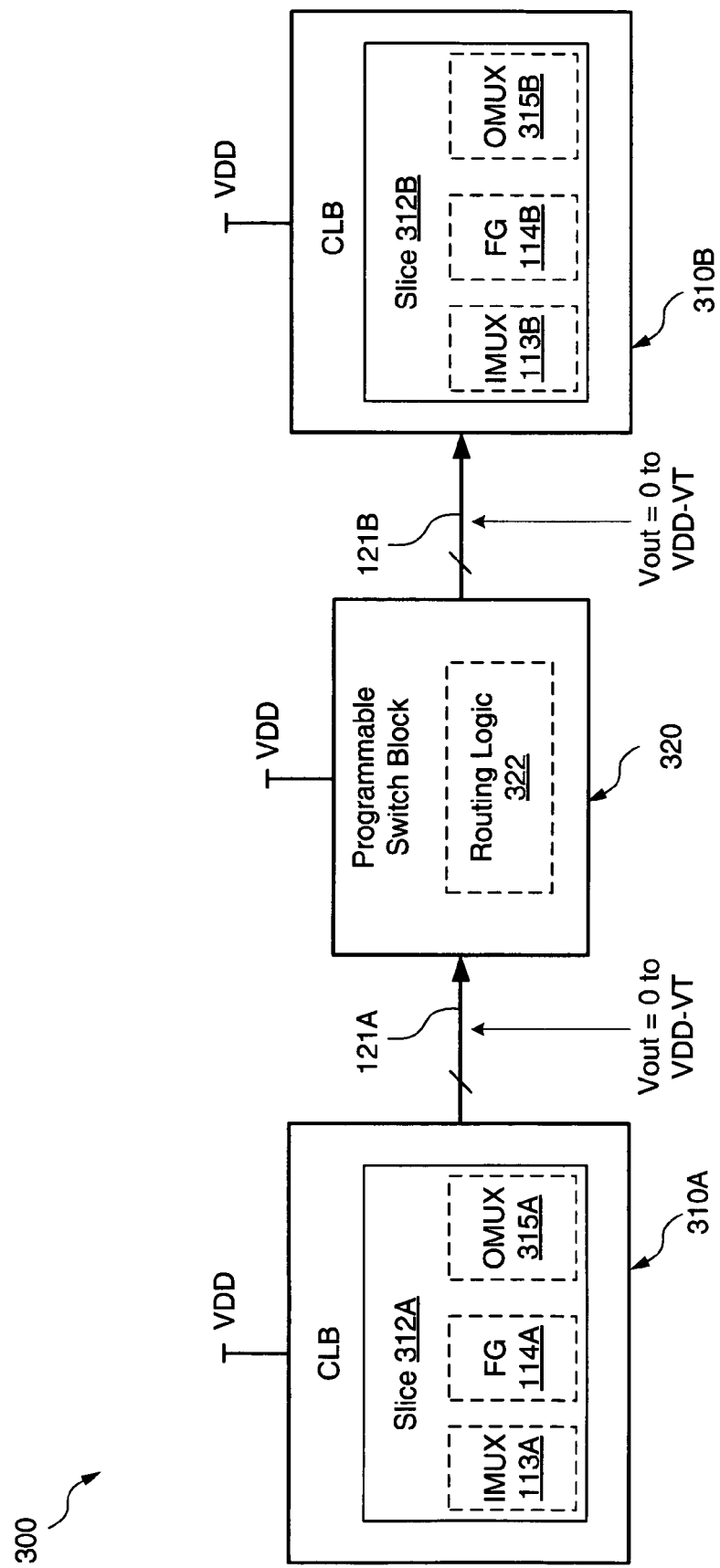
FIG. 3A is a simplified block diagram of a portion of an FPGA having a PSB and two CLBs coupled together via interconnect signal lines in accordance with some embodiments of the present invention.
Figure 3B:
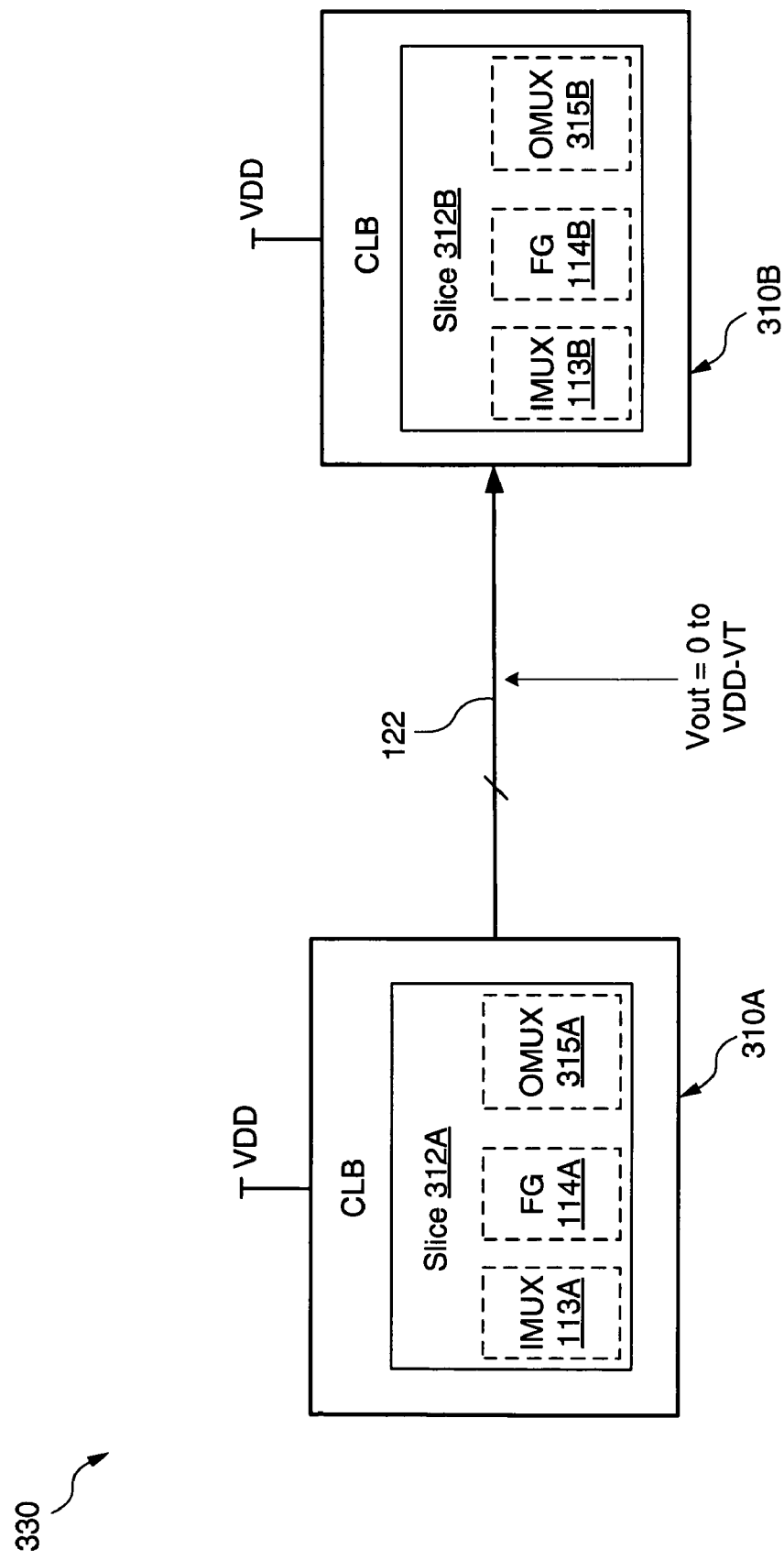
FIG. 3B is a simplified block diagram of another embodiment of the FPGA portion of FIG. 3A.

FIG. 3A shows a simplified portion 300 of an FPGA architecture including several configurable resources that may be configured in accordance with some embodiments of the present invention. FPGA portion 300 includes a first CLB 310A, a second CLB 310B, a programmable switch block (PSB) 320, a first set of interconnect signal lines 121A coupled between CLB 310A and PSB 320, and a second set of interconnect signal lines 121B coupled between PSB 320 and CLB 310B. For simplicity, other well-known components of FPGA portion 300 (e.g., other CLBs, other PSBs, other interconnect signal lines, and other various configurable resources) are not shown in FIG. 3A. Further, for simplicity, the interconnect signal lines 121A-121B are represented collectively in FIG. 3A, and only two CLBs 310A-310B and one PSB 320 are shown in FIG. 3A. For example, although not shown in FIG. 3A for simplicity, CLBs 310A-310B and/or PSB 320 may have other input/output (I/O) connections to other resources via other interconnect signal lines. Thus, for actual embodiments, the FPGA architecture of FIG. 3A may include any number of logic blocks (e.g., CLBs 310 and/or PSB 320) selectively interconnected by any number of interconnect signal lines 121. In addition, although signal lines 121 are shown in FIG. 3A and discussed below as being unidirectional signal lines, for actual embodiments, signal lines 121 may be bi-directional signal lines and/or multi-bit buses. For other embodiments, CLBs 310A-310B may be directly connected to each other via signal lines 122 without using PSB 320, for example, as depicted in FIG. 3B.

Referring again to FIG. 3A, each CLB 310A and 310B has a power terminal coupled to a supply voltage VDD, and includes a number of configurable logic elements such as exemplary slices 312A and 312B, respectively. For simplicity, only one exemplary slice 312 is shown in each CLB 310 of FIG. 3A. For actual embodiments, each CLB 310 may include any suitable number of slices 312 and/or other well-known circuitry (not shown for simplicity). Each slice 312 includes a plurality of well-known input multiplexing (IMUX) circuits 113, a plurality of well-known function generators (FG) 114, a plurality of output multiplexing (OMUX) circuits 315, and various other well-known logic elements (not shown for simplicity) that together may be programmed to implement a variety of logic functions in response to configuration data provided thereto. IMUX circuits 113 selectively route input signals from the interconnect signal lines to corresponding inputs of FG 114, which in turn may be configured (e.g., using configuration data) to implement various logic functions in a well-known manner. OMUX circuits 315 selectively route signals output from FG 114 to other FPGA resources via designated interconnect signal lines.

IMUX circuits 113A-113B may be used, in accordance with some embodiments of the present invention, not only to selectively route input signals received from interconnect signal lines 121 to corresponding inputs of FG 114A-114B, respectively, but also to increase the peak-to-peak voltage swing of such input signals from a relatively low level suitable for reducing power dissipation of signals transmitted over interconnect signal lines 121 to a relatively high level suitable for processing by logic within corresponding FGs 114A-114B. For some embodiments, multiplexing circuit 200 of FIG. 2 may be used to implement IMUX circuits 113A-113B of FPGA portion 300, although for other embodiments, other signal multiplexing circuits may be used. OMUX circuits 315A-315B may be configured, in accordance with some embodiments of the present invention, not only to selectively route signals output from corresponding outputs of FGs 114A-114B, respectively, to interconnect signal lines 121 but also to decrease the peak-to-peak voltage swing of such output signals from the relatively high level to the relatively low level, thereby reducing the dynamic power dissipation associated with transmitting signals over the interconnect signal lines. In this manner, embodiments of the present invention may reduce the dynamic power dissipation of configurable IC devices such as FPGA portion 300 without sacrificing performance, as explained in more detail below.

PSB 320 of FIG. 3A has a power terminal coupled to VDD, and includes routing logic 322 that may be configured (e.g., using configuration data) to selectively route signals between interconnect signal lines 121A and 121B. As mentioned above, for actual embodiments, PSB 320 may include I/O connections to other various FPGA resources via other interconnect signal lines. Thus, although not shown for simplicity, routing logic 322 may be configured to selectively route signals between other interconnect signal lines. Accordingly, routing logic 322 of PSB 320 may receive signals from any number of CLBs such as CLB 310A and/or from other PSBs via the interconnect signal lines, and may output signals to any number of CLBs such as CLB 310B and/or to other PSBs via the interconnect signal lines. In accordance with some embodiments of the present invention, routing logic 322 may translate the voltage swing of signals received from interconnect signal lines 121A from relatively low levels to relatively high levels, and may translate the voltage swing of signals output to interconnect signal lines 121B from relatively high levels to relatively low levels.

Figure 4A:
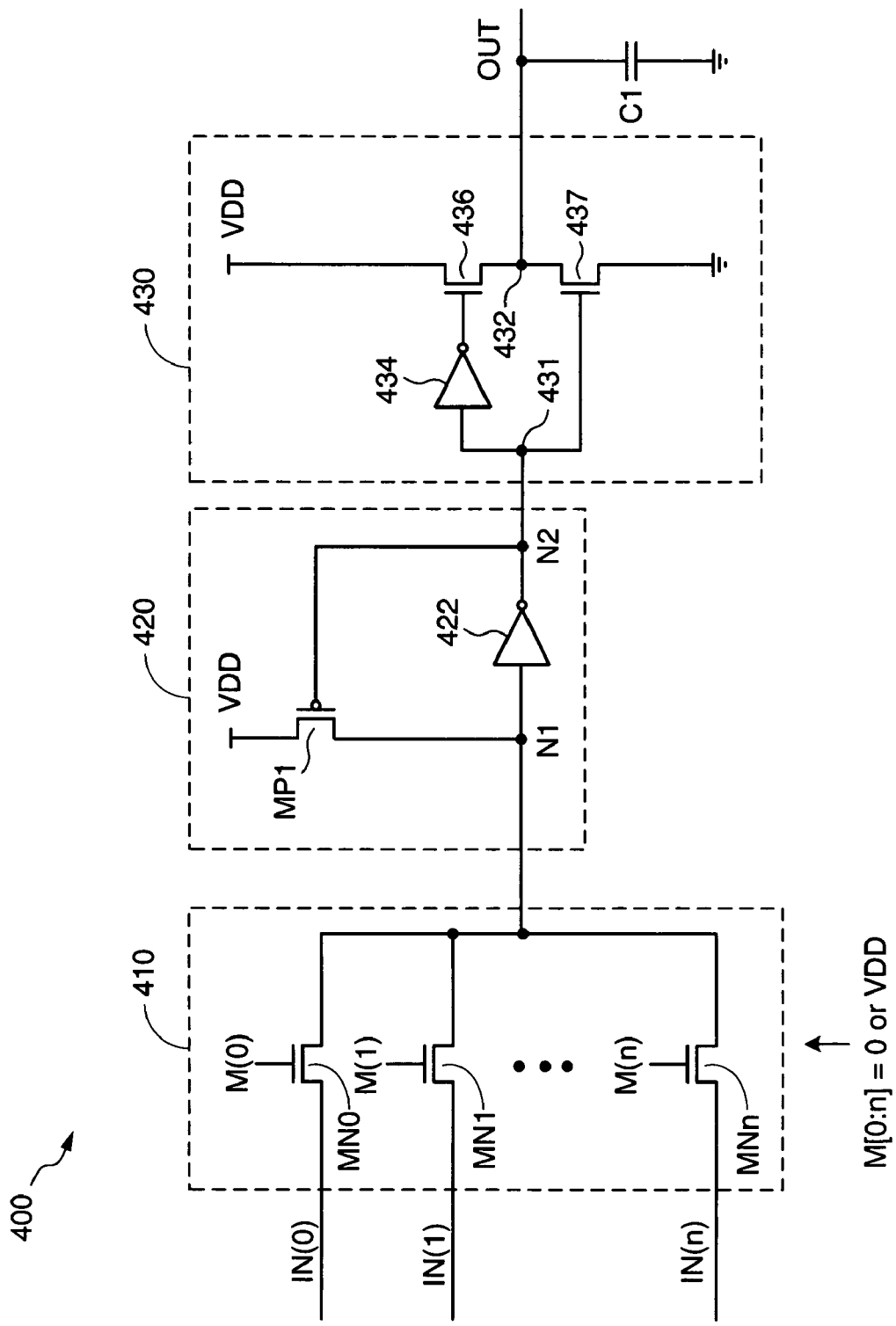
FIG. 4A is a circuit diagram of a multiplexing circuit configured in accordance with one embodiment of the present invention.

FIG. 4A shows a multiplexing circuit 400 configured in accordance with some embodiments of the present invention. Circuit 400 includes a multiplexer circuit (MUX) 410, a level-restoring circuit 420, and an output buffer 430. MUX 410 is similar in architecture and operation to MUX 210 of FIG. 2. The control signals M(0)-M(n) for respective pass transistors MN0-MNn may be configuration bits stored in corresponding configuration memory cells (not shown for simplicity). For some embodiments, the control signals M(0)-M(n) may have a logic "0" value of 0 volts and have a logic "1" value of VDD. For other embodiments, the control signals M(0)-M(n) may have a logic "0" value of 0 volts and have a logic "1" value greater than VDD, thereby overdriving the gate of the selected NMOS pass transistor MNx to maximize performance.

Figure 2:
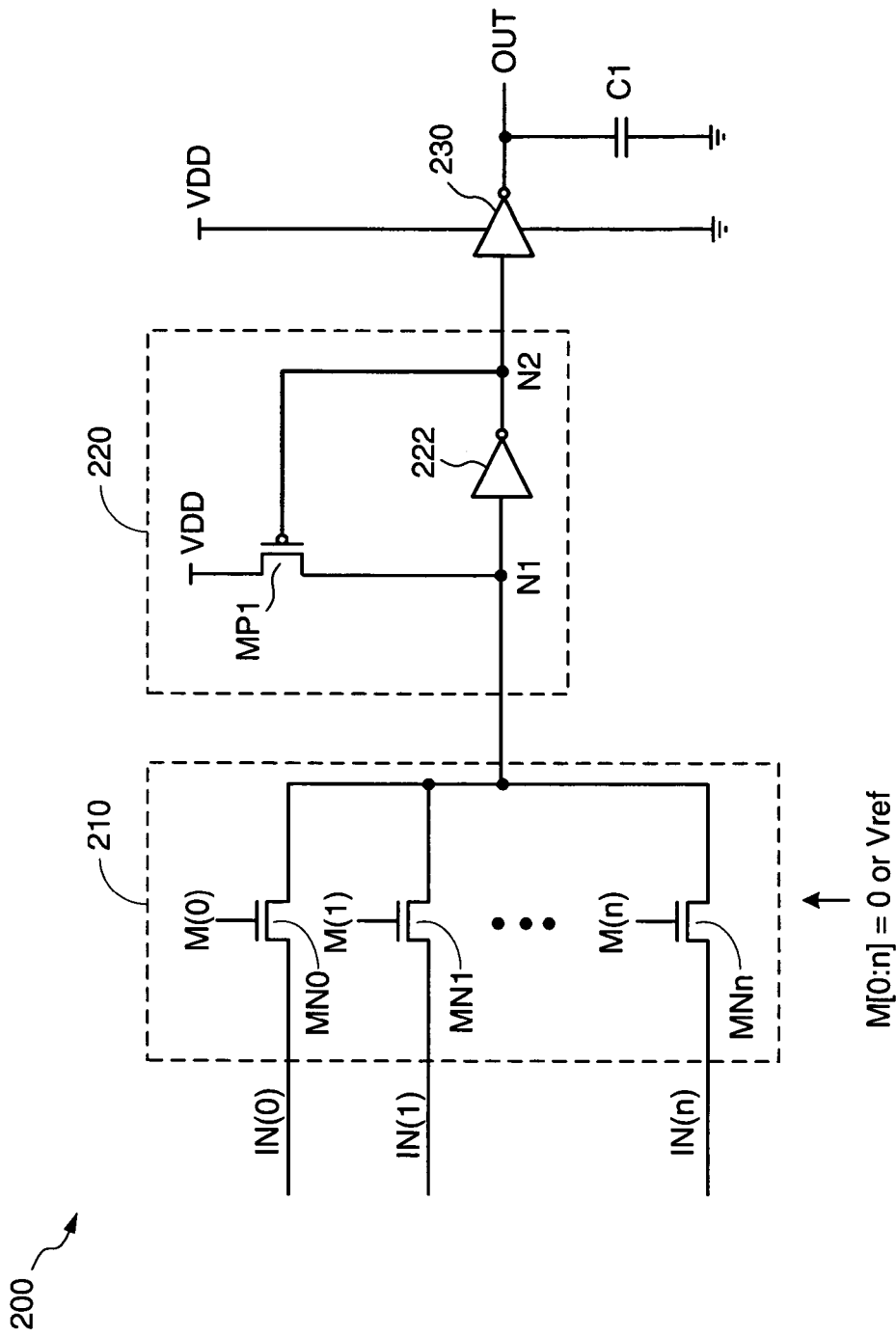
FIG. 2 is a circuit diagram of a well-known multiplexing circuit typically employed in the CLBs and the PSB of FIG. 1.

Level-restoring circuit 420 is similar in architecture and operation to level-restoring circuit 220 of FIG. 2, and thus is not described again. Although not shown for simplicity, CMOS inverter 422 has power terminals coupled to VDD and to ground potential.

Output buffer 430, which is a logically inverting circuit having an input node 431 coupled to output node N2 of level restoring circuit 420 and having an output node 432, is formed by a well-known CMOS inverter 434 and two NMOS transistors 436-437. NMOS transistors 436-437 are connected in series between VDD and ground potential. The drain of NMOS transistor 437 and the source of NMOS transistor 436 are coupled together to form output node 432. The gate of NMOS transistor 437 is coupled to input node 431, and the gate of NMOS transistor 436 is coupled to input node 431 via CMOS inverter 434. Although not shown for simplicity, CMOS inverter 434 has power terminals coupled to VDD and to ground potential.

For some embodiments, multiplexing circuit 400 may be used to implement OMUX circuits 315A-315B of CLBs 310A-310B, respectively, of FPGA portion 300 of FIG. 3A. For such embodiments, pass transistors MN0-MNn of circuit 400 may be coupled directly to corresponding outputs of FGs 114A-114B, respectively, and output node 432 may be coupled directly to a corresponding interconnect signal line 121. In operation, circuit 400 translates the voltage swing of input signals IN provided by FG 114 from a relatively high voltage swing (e.g., between approximately 0 and VDD) to a relatively low voltage swing (e.g., between approximately 0 and VDD-VT, where VT is the threshold voltage of NMOS transistor 436).

Figure 1:
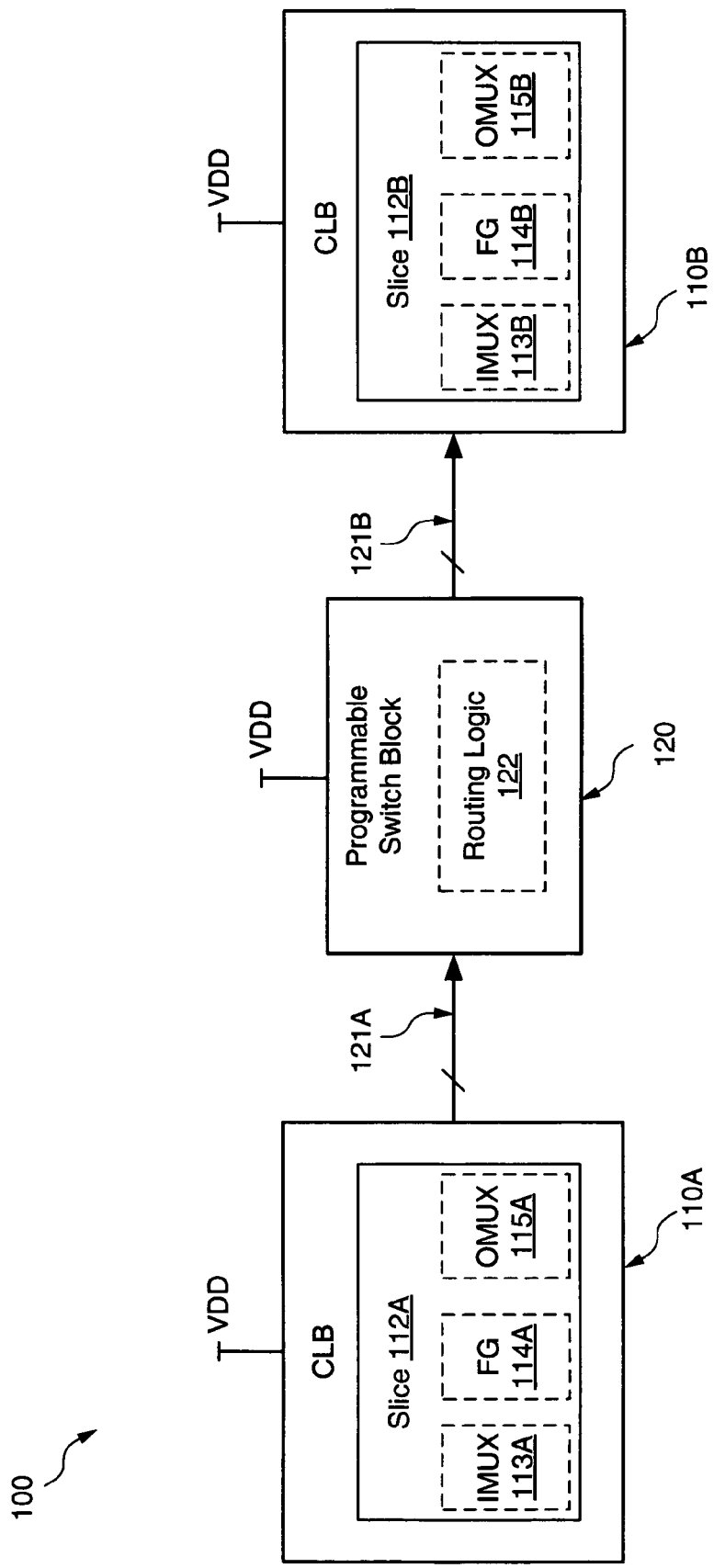
FIG. 1 is a simplified block diagram of a portion of a conventional FPGA having interconnect signal lines connecting a programmable switch block (PSB) to two configurable logic blocks (CLBs)

For example, referring also to FIG. 3A, if circuit 400 receives a logic "1" input signal IN(0) having a voltage approximately equal to VDD from FG 114, and control signal M(0) is asserted (e.g., to VDD), pass transistor MN0 passes the input signal to input node N1 of level-restoring circuit 420. Because both the gate and drain of pass transistor MN0 are at approximately VDD, the voltage level of signal IN(0) decreases by VT as it passes through transistor MN0 so that node N1 is at approximately VDD-VT. CMOS inverter 422 logically complements the logic "1" signal at node N1 to produce a logic "0" signal at node N2, which turns on weak PMOS pull-up transistor MP1 to pull node N1 from approximately VDD-VT to approximately VDD. The logic low signal at node N2 turns off NMOS transistor 437, which isolates node 432 from ground potential. The logic low signal at node N2 is logically inverted by CMOS inverter 434 to provide a logic high signal having a voltage of approximately VDD to the gate of NMOS transistor 436. Because both the gate and drain of NMOS transistor 436 are at VDD, NMOS transistor 436 pulls output node 432 to approximately VDD-VT, thereby providing a logic "1," output signal OUT having a relatively low peak voltage equal to approximately VDD-VT onto corresponding interconnect signal line 121. In this manner, circuit 400 may ensure that signals transmitted on interconnect signal lines 121 from CLBs 310 have a relatively low voltage swing, thereby reducing dynamic power dissipation associated with transmitting signals over interconnect signal lines 121, for example, as compared to prior FPGA portion 100 of FIG. 1.

For other embodiments, level-restoring circuit 420 and output buffer 430 may be eliminated from multiplexing circuit 400. However, although eliminating level-restoring circuit 420 and output buffer 430 from multiplexing circuit 400 reduces circuit area, the elimination of output buffer 430 also reduces the drive strength of the output signal OUT provided to the interconnect signal lines, which may be undesirable for some applications.

As mentioned above, circuit 200 of FIG. 2 may be used to implement IMUX circuits 113A-113B of CLBs 310A-320B, respectively, to perform signal routing functions and level shifting functions. For example, referring to FIGS. 2 and 3A, if circuit 200 receives a logic "1" input signal IN(0) having a voltage approximately equal to VDD-VT from interconnect signal line 121B, and control signal M(0) is asserted (e.g., to VDD), pass transistor MN0 passes the input signal to input node N1 of level-restoring circuit 220. Because the gate of pass transistor MN0 is at approximately VDD and the drain of MN0 is at approximately VDD-VT, the logic "1" signal at node N1 is approximately equal to VDD-VT, i.e., there is no additional VT drop across MN0. CMOS inverter 222 logically complements the logic "1" signal to produce a logic "0" signal at node N2, which turns on weak PMOS pull-up transistor MP1 to pull node N1 from approximately VDD-VT to approximately VDD. Thus, transistor MP1 level shifts the voltage at node N1 from VDD-VT to VDD. The logic low signal at node N2 is logically complemented by CMOS inverter 230 to output a logic "1" signal having a voltage approximately equal to VDD to FG 114B, which as discussed above is suitable for maximizing performance of FG 114B. In this manner, existing multiplexing circuit architectures (e.g., multiplexing circuit 200 of FIG. 2) may be used to translate signals received from the interconnect signal lines from relatively low voltage swings to relatively high voltage swings without requiring additional (e.g., separate) circuitry to perform low-to-high level shifting functions.

Multiplexing circuit 400 may also be used to implement routing logic 322 of PSB 320 of FPGA portion 300 of FIG. 3A. For such embodiments, pass transistors MN0-MNn of circuit 400 may be coupled directly to interconnect signal lines 121A, and output node 432 may be coupled directly to a corresponding interconnect signal line 121B. In operation, output circuit 400 translates the voltage swing of input signals IN received from signal lines 121A from a relatively low level to a relatively high level suitable for processing by PSB 320, and then translates the signals to a relatively low voltage swing suitable for output onto interconnect signal line 121B. For example, if circuit 400 receives a logic "1" input signal IN(0) having a voltage approximately equal to VDD-VT from interconnect signal lines 121A, and control signal M(0) is asserted (e.g., to VDD), pass transistor MN0 passes the input signal to input node N1 of level-restoring circuit 420. Because the gate of pass transistor MN0 is at approximately VDD and the drain of MN0 is at approximately VDD-VT, the logic "1" signal at node N1 is approximately equal to VDD-VT, i.e., there is no additional VT drop across MN0. CMOS inverter 422 logically complements the logic "1" signal to produce a logic "0" signal at node N2, which turns on weak PMOS pull-up transistor MP1 to pull node N1 from approximately VDD-VT to approximately VDD. Thus, the pull-up PMOS transistor level shifts the voltage at node N1 from VDD-VT to VDD. The logic low signal at node N2 turns off NMOS transistor 437, which isolates output node 432 from ground potential. The logic low signal at node N2 is logically inverted by CMOS inverter 434 to provide a logic high signal having a peak voltage of approximately VDD to the gate of NMOS transistor 436. Because both the gate and drain of NMOS transistor 436 are at VDD, NMOS transistor 436 pulls output node 432 to approximately VDD-VT, thereby providing a logic "1" output signal OUT having a relatively low peak voltage equal to approximately VDD-VT to the corresponding interconnect signal line 121B.

Figure 3C:
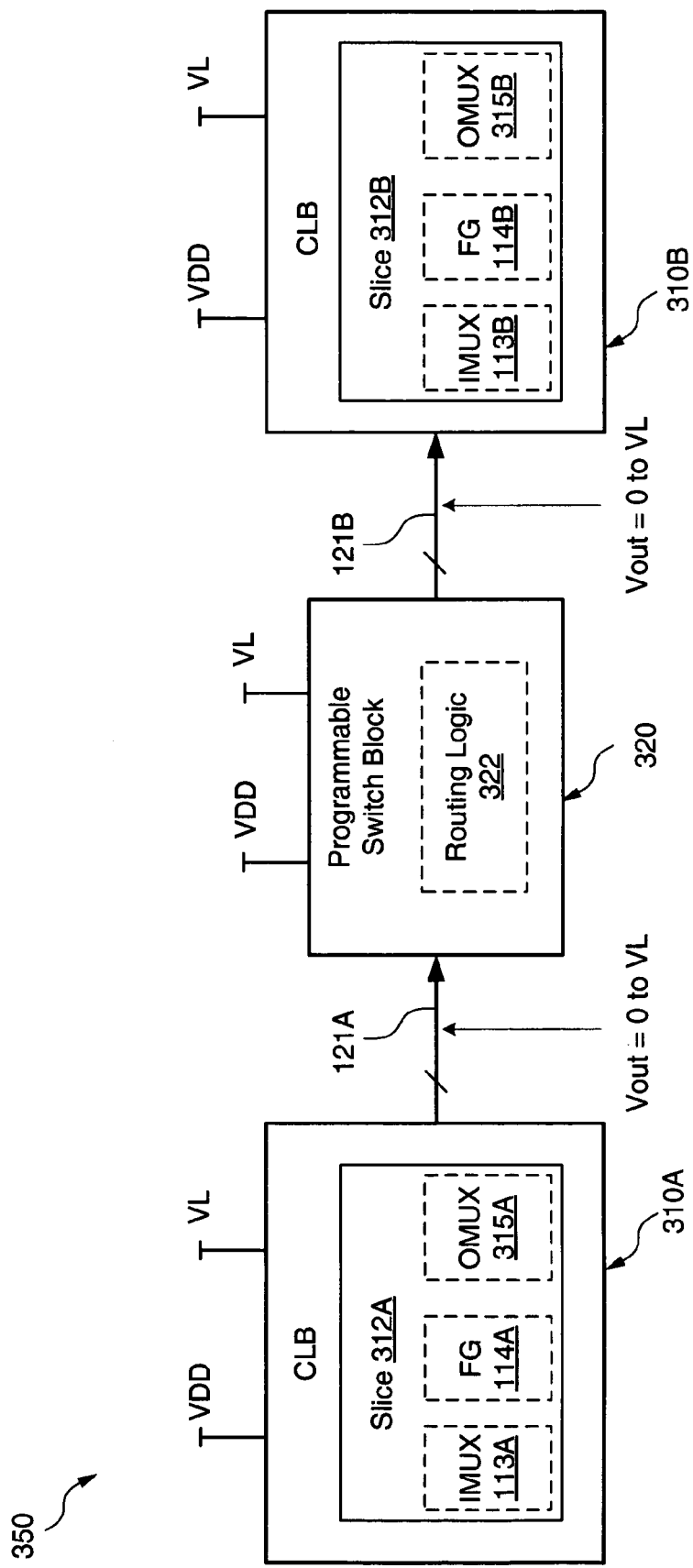
FIG. 3C is a simplified block diagram of a portion of an FPGA having a PSB and two CLBs coupled together via interconnect signal lines in accordance with other embodiments of the present invention.

For other embodiments, the CLBs 310A-310B and PSB 320 may include power terminals connected to VDD and to a low voltage supply VL, where VL is less than VDD (e.g., VL=VDD−VT), for example, as depicted by FPGA portion 350 shown in FIG. 3C. For one embodiment, VL may be a voltage supply separate from VDD. The operation of FPGA portion 350 is similar to that described above with respect to FIG. 3A, except that OMUX circuits 315A-315B and routing logic 322 have power terminals coupled to VDD and to VL.

Figure 4B:
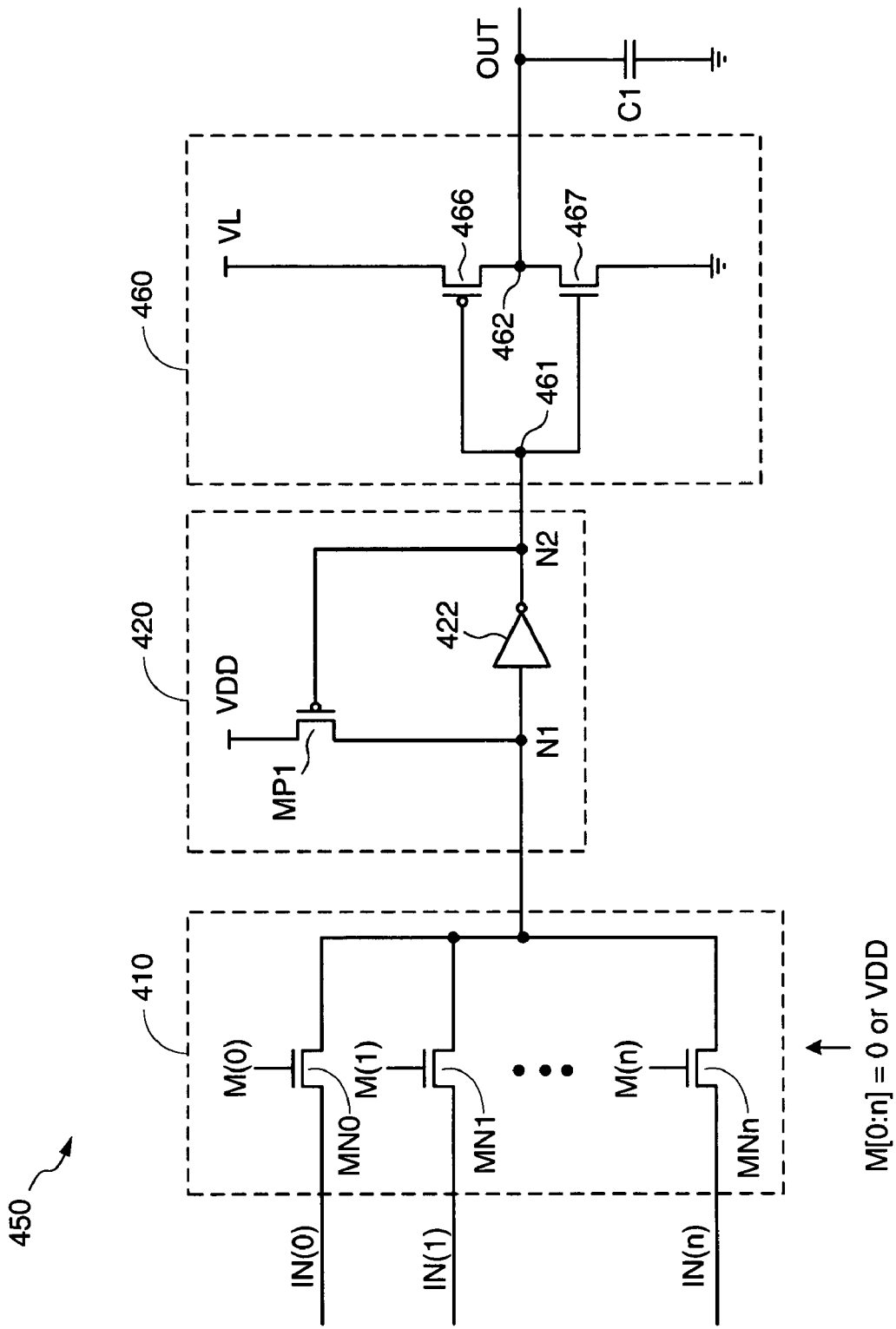
FIG. 4B is a circuit diagram of a multiplexing circuit configured in accordance with another embodiment of the present invention.

For example, FIG. 4B shows a multiplexing circuit 450 configured in accordance with other embodiments of the present invention. Circuit 450 includes MUX 410, level-restoring circuit 420, and an output buffer 460. The architecture and operation of MUX 410 and level-restoring circuit 420 of FIG. 4B are similar to that described above with respect to FIG. 4A, and thus are not repeated. Output buffer 460 is formed by a PMOS transistor 466 and an NMOS transistor 467 connected in series between VL and ground potential. The common drains of transistors 466-467 form an output node 462 of output buffer 460, and the common gates of transistors 466-467 form an input node 461 of output buffer 460. Output buffer 460 translates the voltage swing of signals at its input node 461 from a relatively high level to a relatively low level suitable for output onto interconnect signal lines 121. For example, if the signal at input node 461 is logic "0," NMOS transistor 467 turns off to isolate output node 462 from ground potential. The logic low signal at node 461 turns on PMOS transistor 466, which pulls node 462 high toward VL to generate a logic "1" output signal having a voltage of approximately VL.

Multiplexing circuit 450 may be used to implement OMUX circuits 315A-315B of CLBs 310A-310B, respectively, of FPGA portion 350 of FIG. 3C, and/or to implement routing logic 322 of PSB 320 of FPGA portion 350 of FIG. 3C in a manner similar to that described above with respect to FIG. 4A.

For other embodiments of FIG. 4B, VL may be any voltage between VDD and VDD-VT. For example, as long as VL>VTn+|VTp| (where VTn corresponds to a threshold voltage for an NMOS transistor and VTp corresponds to a threshold voltage for a PMOS transistor), the rise delay penalty associated with connecting output buffer circuit 460 to VL (as opposed to VDD) is minimal.

Figure 4C:
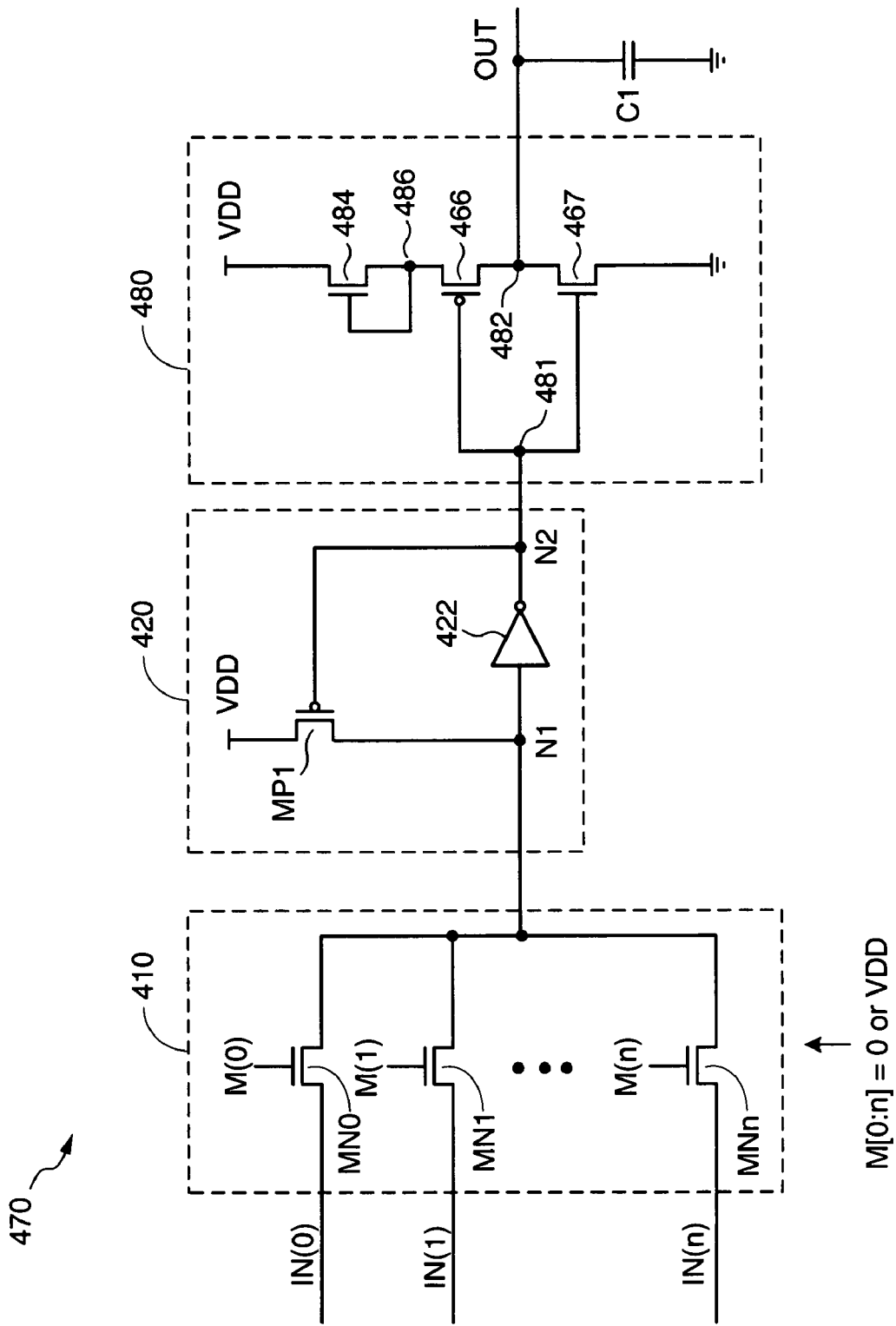
FIG. 4C is a circuit diagram of a multiplexing circuit configured in accordance with yet another embodiment of the present invention.

Referring again to FIG. 3A, for other embodiments, a low voltage VL that is less than VDD may be generated from VDD using well-known circuitry, for example, by connecting one or more diode-connected transistors to VDD to generate VL within the logic blocks without requiring a separate power terminal coupled to a second supply voltage VL, as may be required for embodiments of FIG. 3B. For example, FIG. 4C shows a multiplexing circuit 470 configured in accordance with another embodiment of the present invention. Multiplexing circuit 470, which may be used to implement OMUX circuits 315A-315B of CLBs 310A-310B, respectively, of FPGA portion 300 of FIG. 3A, and/or to implement routing logic 322 of PSB 320 of FPGA portion 300 of FIG. 3A, includes MUX 410, level-restoring circuit 420, and an output buffer 480. The architecture and operation of MUX 410 and level-restoring circuit 420 of FIG. 4C are similar to that described above with respect to FIGS. 4A and 4B, and thus are not repeated. Output buffer 480 is formed by an NMOS diode-connected transistor 484, PMOS transistor 466, and NMOS transistor 467. Diode-connected transistor 484 is coupled between VDD and a low voltage node 486. Transistors 466-467, which form a well-known CMOS inverter, are connected in series between node 486 and ground potential. The common drains of transistors 466-467 form an output node 482 of output buffer 480, and the common gates of transistors 466-467 form an input node 481 of output buffer 480. Diode-connected transistor 484 creates a low voltage VL=VDD−VT at node 486. In this manner, transistors 466-467 generate an output signal OUT having a voltage swing between approximately ground potential and VDD-VT, thereby translating the voltage swing of signals at node 481 from a relatively high level to a relatively low level suitable for output onto interconnect signal lines 121. Similarly in some embodiments, an external diode-connected transistor may be used to provide low voltage VL for one or more output buffers 480.

Figure 5:
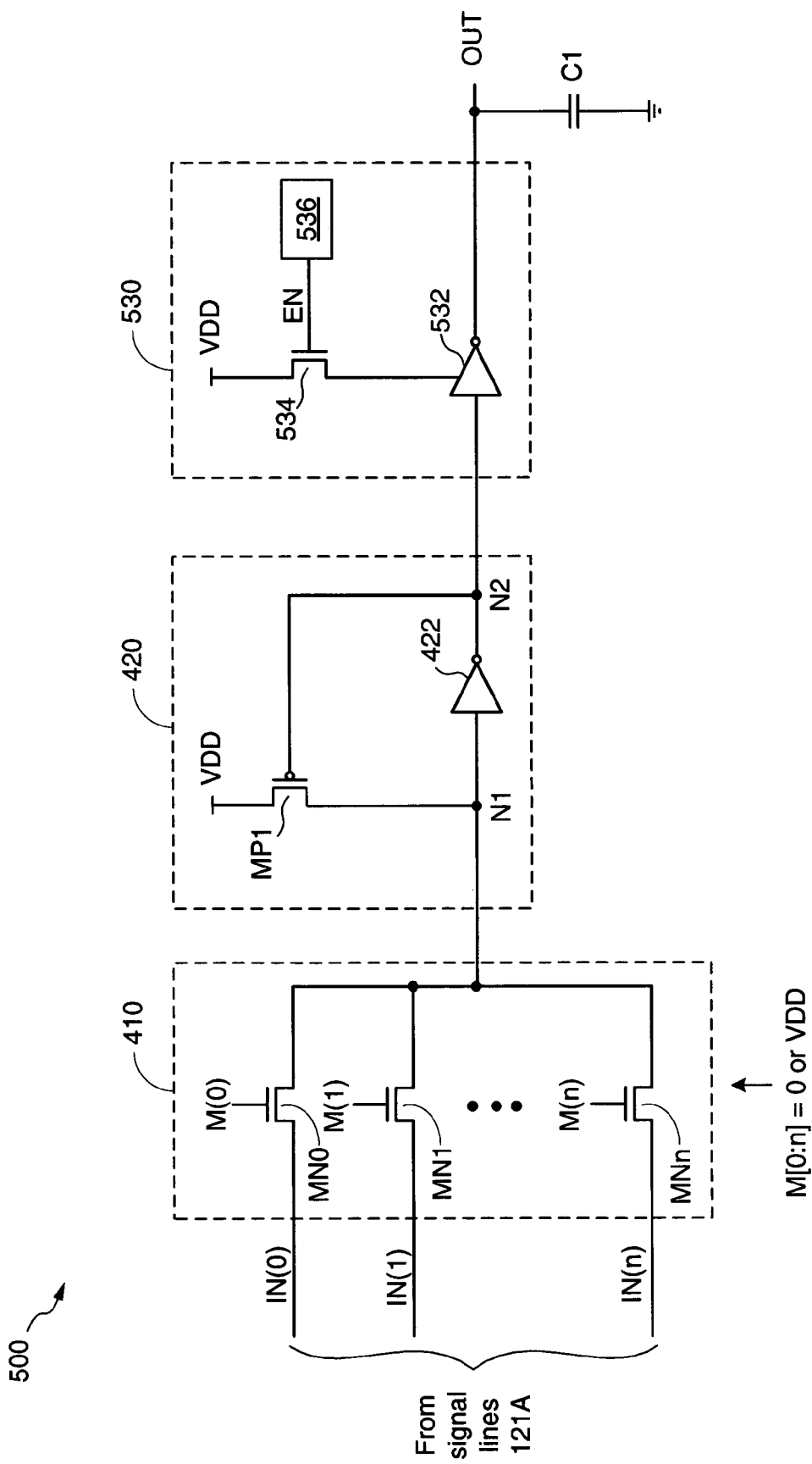
FIG. 5 is a circuit diagram of a multiplexing circuit configured in accordance with still another embodiment of the present invention.

FIG. 5 shows a multiplexing circuit 500 configured in accordance with yet another embodiment of the present invention, and which may be used to implement OMUX circuits 315A-315B of CLBs 310A-310B, respectively, of FPGA portion 300 of FIG. 3A, and/or to implement routing logic 322 of PSB 320 of FPGA portion 300 of FIG. 3A. Referring to FIG. 5, circuit 500 includes MUX 410, level-restoring circuit 420, and an output buffer 530. The architecture and operation of MUX 410 and level-restoring circuit 420 of circuit 500 are similar to that described above with respect to FIG. 4A, and thus are not described again. Output buffer 530 includes a well-known CMOS inverter 532, an NMOS pull-up transistor 534, and a memory cell 536. CMOS inverter 532, which is coupled between the output node of circuit 500 and output node N2 of level-restoring circuit 420, includes a first power terminal coupled to VDD via NMOS pull-up transistor 534, which has a gate coupled to memory cell 536. Although not shown for simplicity, CMOS inverter 532 has a second power terminal coupled to ground potential. Memory cell 536, which may be any suitable volatile or non-volatile storage element, stores an enable signal EN for controlling the operation of NMOS pull-up transistor 534. For some embodiments, memory cell 536 may be a configuration memory cell (e.g., an SRAM cell).

In operation, if EN is asserted to logic high (e.g., EN≈VDD), NMOS pull-up transistor 534 turns on and pulls the first power terminal of CMOS inverter 532 to approximately VDD-VT, which in turn limits the peak-to-peak voltage swing of the output signal OUT to between approximately 0 volts and VDD-VT without requiring a separate low-voltage supply, for example, such as VL of FPGA portion 350 of FIG. 3C. Conversely, if EN is de-asserted to logic low (e.g., EN≈0), NMOS pull-up transistor 534 turns off and isolates the first power terminal of CMOS inverter 532 from VDD, thereby effectively disabling CMOS inverter 532, which in turn may advantageously reduce and/or even eliminate undesirable DC leakage currents through CMOS inverter 532.

Figure 6:
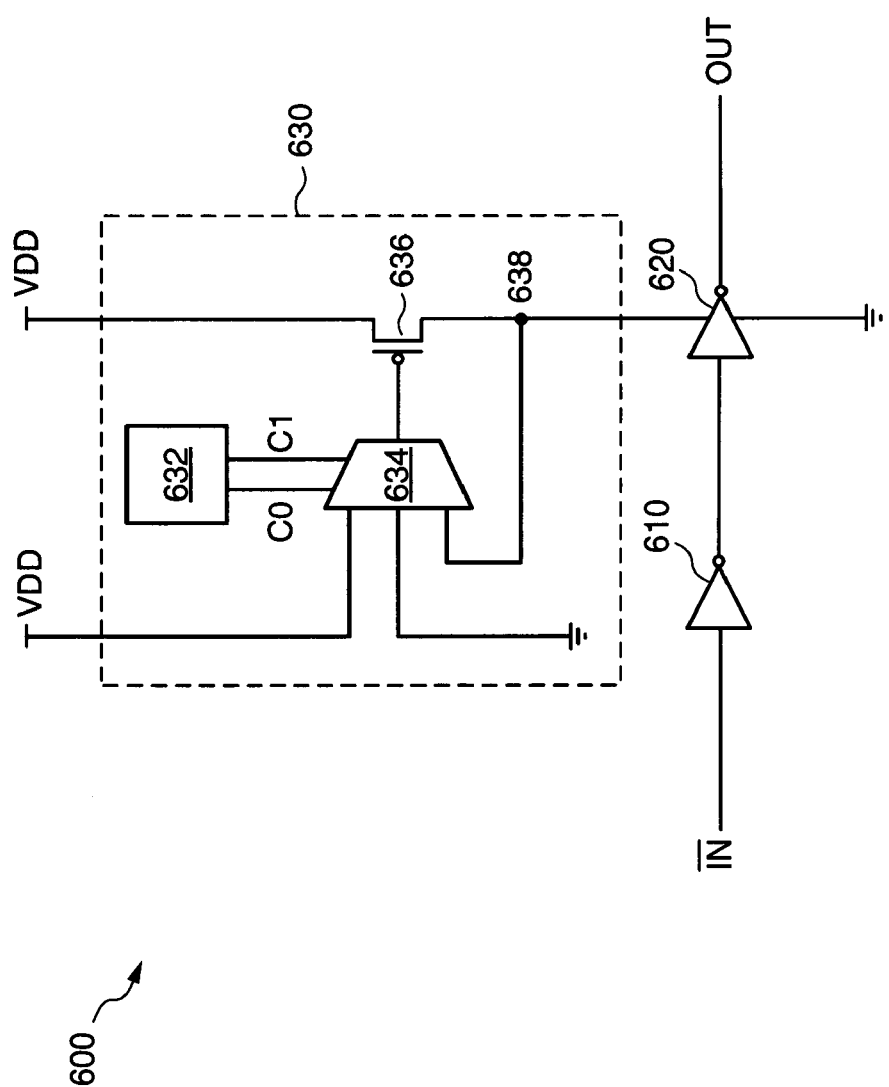
FIG. 6 is a circuit diagram of an output buffer that may be employed in the multiplexing circuit of FIG. 4A.

FIG. 6 shows an output buffer or level shifter 600 that, in accordance with another embodiment of the present invention, may be used as output buffer 430 of multiplexing circuit 400 of FIG. 4A. Circuit 600 includes well-known CMOS inverters 610 and 620 connected in series between the input IN and the output OUT of circuit 600. Although not shown in FIG. 6 for simplicity, CMOS inverter 610 has power terminals coupled to VDD and to ground potential. CMOS inverter 620 has a first power terminal coupled to a voltage selection circuit 630, and has a second power terminal coupled to ground potential.

Voltage selection circuit 630 includes a storage element 632, a multiplexer (MUX) 634, and a PMOS pull-up transistor 636. Storage element 632, which may include any suitable volatile or non-volatile memory cells, stores control signals C0-C1 for MUX 634. For some embodiments, storage element 632 may include two well-known configuration memory cells (e.g., SRAM cells) for storing two configuration bits that indicate the logic states of C0-C1, although for other embodiments storage element 632 may be any other suitable memory device. MUX 634 includes a first input coupled to VDD, a second input coupled to ground potential, a third input coupled to the power terminal of CMOS inverter 620 at node 638, an output coupled to the gate of PMOS transistor 636, and control inputs to receive C0-C1 from storage element 632. PMOS transistor 636 is coupled between VDD and the power terminal of CMOS inverter 620 at node 638.

In accordance with the present invention, circuit 600 may be used to selectively alter the voltage swing of the input signal IN to generate a suitable voltage swing for output signal OUT in response to control signals C0-C1. For example, if control signals C0-C1 select the first input of MUX 634, MUX 634 drives the gate of PMOS transistor 636 to VDD, thereby turning off PMOS transistor 636 to cause node 638 to float. In this mode, the floating power terminal 638 of CMOS inverter 620 disables output level shifter circuit 600, for example, when it is not desired for output circuit 600 to be functional, thereby reducing undesirable leakage currents. If control signals C0-C1 select the second input of MUX 634, MUX 634 drives the gate of PMOS transistor 636 to ground potential, thereby turning on PMOS transistor 636 to pull power node 638 to approximately VDD. In this mode, driving the power terminal of CMOS inverter 620 with VDD causes CMOS inverter 620 to produce an output signal OUT having a peak-to-peak voltage swing between approximately 0 and VDD, thereby effectively placing circuit 600 in a high-performance mode to maximize the voltage swing of OUT. Further, if control signals C0-C1 select the third input of MUX 634, MUX 634 couples the gate of PMOS transistor 636 to its drain terminal at node 638, thereby configuring PMOS transistor 636 as a diode-connected transistor that drives the power terminal 638 of CMOS inverter 620 to approximately VDD-VT. In this mode, driving the power terminal 638 of CMOS inverter 620 to VDD-VT causes CMOS inverter 620 to produce an output signal OUT having a peak-to-peak voltage swing between approximately 0 and VDD-VT, which as mentioned above is desirable for minimizing dynamic power dissipation associated with interconnect signal lines 121.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. A configurable integrated circuit (IC) device, comprising:
    a first logic block including a number of first logic resources and an output multiplexing circuit, the first logic block having a power terminal coupled to a supply voltage;
    a second logic block including a number of second logic resources and an input multiplexing circuit, the second logic block having a power terminal coupled to the supply voltage; and
    a number of interconnect signal lines connected between the output multiplexing circuit and the input multiplexing circuit,
    wherein the input multiplexing circuit translates the voltage swing of logic signals received from the interconnect signal lines from a relatively low peak level to a relatively high peak level,
    wherein the output multiplexing circuit translates the voltage swing of logic signals generated in the first logic resources from the relatively high peak level to the relatively low peak level that is a voltage level of at least a threshold voltage below the relatively high peak level, and
    wherein the output multiplexing circuit comprises an output buffer having an input coupled to the first logic resources, the output buffer translating the voltage swing of logic signals received from the first logic resources from the relatively high peak level to the relatively low peak level and comprising an inverter having a first power terminal coupled to a low voltage supply and having a second power terminal coupled to ground potential, wherein the low voltage supply is less than the supply voltage.

2. The configurable IC device of claim 1, wherein the relatively low peak level is approximately equal to the supply voltage minus a threshold voltage of a transistor provided within the input multiplexing circuit, and the relatively high peak level is approximately equal to the supply voltage.

3. The configurable IC device of claim 1, wherein the first and second logic blocks comprise configurable logic blocks of a field programmable gate array.

4. The configurable IC device of claim 1, wherein at least one of the first logic block and the second logic block comprises routing logic.

5. The configurable IC device of claim 1, wherein the input multiplexing circuit comprises:
    a plurality of pass transistors each having a first terminal connected directly to a corresponding interconnect signal line, a gate to receive a corresponding control signal, and a second terminal; and
    a level-restoring circuit having an input coupled to the second terminals of the pass transistors and having an output coupled directly to the second logic resources.

6. The configurable IC device of claim 1, wherein the output multiplexing circuit comprises:
    a plurality of pass transistors each having a first terminal connected directly to the first logic resources, a gate to receive a corresponding control signal, and a second terminal; and
    a level-restoring circuit having an input coupled to the second terminals of the pass transistors;
    wherein the input of the output buffer is coupled to an output of the level-restoring circuit and an output of the output buffer is coupled to a corresponding one of the interconnect signal lines.

7. A configurable integrated circuit (IC) device, comprising:
    a first logic block including a number of first logic resources and an output multiplexing circuit, the first logic block having a power terminal coupled to a supply voltage;
    a second logic block including a number of second logic resources and an input multiplexing circuit, the second logic block having a power terminal coupled to the supply voltage; and
    a number of interconnect signal lines connected between the output multiplexing circuit and the input multiplexing circuit, wherein the input multiplexing circuit translates the voltage swing of logic signals received from the interconnect signal lines from a relatively low peak level to a relatively high peak level, wherein the output multiplexing circuit translates the voltage swing of logic signals generated in the first logic resources from the relatively high peak level to the relatively low peak level that is a voltage level of at least a threshold voltage below the relatively high peak level, wherein an output buffer of the output multiplexing circuit comprises:
  an inverter having an input coupled to the output of the level-restoring circuit, a first power terminal coupled to ground potential, and a second power terminal;
  an NMOS pull-up transistor coupled between the supply voltage and the second power terminal of the inverter, and having a gate; and
  a configuration memory cell coupled to the gate of the NMOS pull-up transistor, wherein the memory cell stores an enable signal for controlling the NMOS pull-up transistor.

8. A configurable integrated circuit (IC) device including a supply voltage and a plurality of logic blocks coupled together by a number of sets of interconnect signal lines, each logic block comprising:
  a number of input multiplexing circuits, each having inputs coupled to a first corresponding set of signal lines and having an output coupled to a corresponding logic resource provided within the logic block;
  a number of output multiplexing circuits, each having inputs coupled to corresponding logic resources of the logic block and having an output coupled to a corresponding second signal line; and
  a power rail coupled to the supply voltage, wherein signals processed within the logic resources have a relatively high voltage swing between approximately ground potential and the supply voltage, and signals transmitted over the signal lines have a voltage swing between approximately ground potential and one of a plurality of user-selectable voltages including a low voltage that is a voltage level of at least a threshold voltage less than the supply voltage in response to control signals configuring the output multiplexing circuits.

9. The configurable IC device of claim 8, wherein the low voltage is approximately equal to the supply voltage minus a threshold voltage of a transistor provided within the output multiplexing circuit.

10. The configurable IC device of claim 8, wherein for each logic block:
  the output multiplexing circuit translates the signals received from the logic resources from the relatively high voltage swing to a relatively low voltage swing between approximately ground potential and a voltage level of at least a threshold voltage less than the supply voltage.

11. The configurable IC device of claim 8, wherein for each logic block, the input multiplexing circuit comprises:
  a plurality of pass transistors each having a first terminal connected directly to a corresponding interconnect signal line, a gate to receive a corresponding control signal, and a second terminal; and
  a level-restoring circuit having an input coupled to the second terminals of the pass transistors and having an output coupled directly to the logic resources, wherein the logic block does not include a separate level-shifter circuit coupled to the logic resources or the input multiplexing circuit.

12. The configurable IC device of claim 8, wherein for each logic block, the output multiplexing circuit comprises:
  a plurality of pass transistors each having a first terminal connected directly to the logic resources, a gate to receive a corresponding control signal, and a second terminal;
  an inverter having an input to receive signals from the second terminals of the pass transistors, a first power terminal coupled to ground potential, and a second power terminal; and
  a diode coupled between the supply voltage and the second power terminal of the inverter.

13. The configurable IC device of claim 8, wherein for each logic block, the output multiplexing circuit comprises:
  a plurality of pass transistors each having a first terminal connected directly to the logic resources, a gate to receive a corresponding control signal, and a second terminal;
  an inverter having an input to receive signals from the second terminals of the pass transistors, a first power terminal coupled to ground potential, and a second power terminal;
  an NMOS pull-up transistor coupled between the supply voltage and the second power terminal of the inverter, and having a gate; and
  a configuration memory cell coupled to the gate of the NMOS pull-up transistor, wherein the memory cell stores an enable signal for controlling the NMOS pull-up transistor.

14. The configurable IC device of claim 8, wherein for each logic block, the output multiplexing circuit comprises:
  a plurality of pass transistors each having a first terminal connected directly to the logic resources, a gate to receive a corresponding control signal, and a second terminal;
  an inverter having an input to receive signals from the second terminals of the pass transistors, a first power terminal coupled to ground potential, and a second power terminal;
  a pull-up transistor coupled between the supply voltage and the second power terminal of the inverter, and having a gate;
  a multiplexer having a first input coupled to the supply voltage, a second input coupled to ground potential, a third input coupled to the second power terminal of the inverter, an output coupled to the gate of the pull-up transistor, and a number of control terminals; and
  a configuration memory coupled to the control terminals of the multiplexer.

15. A configurable integrated circuit (IC) device including a plurality of logic blocks coupled together by a number of sets of interconnect signal lines, each logic block comprising:
  a number of input multiplexing circuits, each having inputs coupled to a first corresponding set of signal lines and having an output coupled to a corresponding logic resource provided within the logic block;
  a number of output multiplexing circuits, each having inputs coupled to corresponding logic resources of the logic block and having an output coupled to a second corresponding signal line, wherein at least one of the output multiplexing circuits comprises:
    a plurality of pass transistors each having a first terminal connected directly to the logic resources, a gate to receive a corresponding control signal, and a second terminal;
    an inverter having an input to receive signals from the second terminals of the pass transistors, a first power terminal coupled to ground potential, and a second power terminal;
    a pull-up transistor coupled between the supply voltage and the second power terminal of the inverter, and having a gate;

a multiplexer having a first input coupled to the supply voltage, a second input coupled to ground potential, a third input coupled to the second power terminal of the inverter, an output coupled to the gate of the pull-up transistor, and a number of control terminals; and a configuration memory coupled to the control terminals of the multiplexer, wherein the configuration memory stores configuration information for controlling the multiplexer.

16. The configurable IC device of claim 15, wherein the output multiplexing circuit translates signals received from the corresponding logic resources from a relatively high voltage swing to a relatively low voltage swing in response to the configuration information being in a first state, and the output multiplexing circuit selectively passes signals received from the corresponding logic resources without performing level-shifting functions in response to the configuration information being in a second state.

* * * * *